United States Patent [19]

Acitelli et al.

[11] 4,254,186

[45] Mar. 3, 1981

[54] PROCESS FOR PREPARING EPOXY LAMINATES FOR ADDITIVE PLATING

[75] Inventors: Mario A. Acitelli, Endwell; James T. Woods, Binghamton, both of N.Y.

[73] Assignee: International Business Machines Corporation, Armonk, N.Y.

[21] Appl. No.: 971,125

[22] Filed: Dec. 20, 1978

[51] Int. Cl.³ .......................... B32B 31/00; B05D 5/12
[52] U.S. Cl. ...................................... 428/462; 156/230; 156/239; 156/246; 156/334; 156/247; 156/280; 156/289; 156/330; 156/331; 156/630; 427/98; 427/155; 427/304; 427/331; 428/463; 428/901; 428/415
[58] Field of Search ............... 156/230, 239, 246, 247, 156/280, 289, 327, 330, 335, 629, 630, 633, 634, 635, 645, 231, 331; 427/98, 155, 304, 306, 307, 322, 331; 428/209, 245, 261, 268, 273, 414, 415, 416, 426, 460, 463, 901, 462

[56] References Cited

U.S. PATENT DOCUMENTS

| Re. 28,042 | 6/1974 | Rhodenizer et al. | 204/38 B |
|---|---|---|---|
| 3,925,138 | 12/1975 | Shaul et al. | 156/313 |
| 3,948,701 | 4/1976 | Fasbender et al. | 156/3 |
| 3,955,024 | 5/1976 | Goldman et al. | 428/209 |
| 3,956,041 | 5/1976 | Polichette et al. | 156/3 |
| 3,989,573 | 11/1976 | Sanjana | 156/330 |
| 3,990,932 | 11/1976 | Dupire | 156/230 |
| 4,001,466 | 1/1977 | Shaul et al. | 427/96 |
| 4,029,845 | 6/1977 | Nomura | 428/415 |
| 4,100,312 | 7/1978 | Lombardo et al. | 427/96 |

Primary Examiner—George F. Lesmes
Assistant Examiner—E. Rollins Buffalow
Attorney, Agent, or Firm—Sughrue, Rothwell, Mion, Zinn and Macpeak

[57] ABSTRACT

A process for preparing an epoxy impregnated laminate having an adhesive surface conductive to electroless plating wherein the adhesive surface is applied from a transfer sheet as a substantially uncured phenolic thermosetting resin/nitrile rubber polymer adhesive layer which is thereafter cured by subjecting the laminate to heat and pressure curing conditions.

18 Claims, No Drawings 4,254,186

PROCESS FOR PREPARING EPOXY LAMINATES FOR ADDITIVE PLATING

BACKGROUND OF THE INVENTION

This invention relates to a process for preparing insulating substrates, more specifically electrically insulating substrates suitable for preparing printed circuits by electroless deposition techniques.

It is widely known to utilize substrates comprised of a plurality of fibrous sheets or webs impregnated with thermosettable resin, most usually epoxy resin, as a base on which to form a firmly adherent metal layer or pattern by electroless deposition in order to form printed circuit boards. In the art, prior to electroless deposition or preparatory steps therefor (e.g., etching, seeding or the like), the substrate is subjected to heat and pressure conditions to cure the thermosettable resin and thus form a cured integral laminate onto and/or in which printed circuit patterns are to be formed.

Hereinafter, the above-described type of thermosettable resin impreganted fibrous material, prior to the curing step, will be referred to as an "insulating substrate." After the curing step, the material is referred to as a "cured insulating substrate."

In the prior art, difficulties have been encountered in forming a strong bond between the surface of the cured insulating substrate and an electroless deposited metal layer. Peel strength on the order of 8–10 pounds/square inch or higher is desired but difficult to achieve. One approach in the prior art to improve the bonding strength between a surface of a cured insulating material and an electrolessly deposited metal thereon has been the application of an intermediate adhesive layer prior to electroless metal coating or precursor steps thereof. The prior art describes the application of the adhesive in at least a partially cured state from a transfer base material to the surface of the insulating substrate and thereafter removing the transfer base material and laminating the coated insulating substrate in a conventional manner to form a cured insulating substrate. If the adhesive was not completely cured prior to the transfer operation, curing is completed under the heat and pressure conditions of lamination, say 1,000–1,500 psi at 340° F. for 45 minutes for phenolic impregnated substrate and 200–275 psi at 340° F. for ¼–½ hour for epoxy impregnated substrate.

U.S. Pat. No. 3,956,041 by Polichette et al. discloses a transfer sheet process where a metal foil or plastic transfer sheet is coated with an adhesive composition whch is partially hardened to the "B" stage to produce a solvent-free, non-tacky, not completely hardened surface. Adhesives comprising nitrile rubber/thermosetting phenolic resin are contemplated. The adhesive surface of the transfer material is brought into contact with the surface of an insulating substrate. After subjecting the laminate to the conventional heat and pressure conditions, the transfer base material is removed, e.g., by peeling and then electroless metal plating is carried out.

U.S. Pat. Nos. 3,925,138 and 4,001,460 by Shaul et al. disclose processes which in certain embodiments appear to be similar to Polichette et al., except that the adhesive is substantially fully cured on the transfer base material prior to lamination.

The transfer base material of the prior art can be paper, plastic sheeting, metal foil and the like. Most usually, the transfer base material is selected so that it can be peeled off of the laminate after consolidation by heat and pressure. However, with the use of metal foil transfer base materials, a release agent of some type is preferred to aid peeling, or the metal foil could be etched (dissolved) away after consolidation. See the Shaul et al. patents and U.S. Pat. No. 3,948,701 to Fasbender et al. Also, see the Fasbender et al. patent concerning at least some degree of preliminary hardening, i.e., preliminary condensation in the case of hardening by the condensation mechanism, of the adhesive on the transfer base or carrier material prior to lamination with the insulating substrate.

MacDermid, Inc. of Waterbury, Conn., markets products under the trade name Pladd II ®. One of these products is believed to be a metal foil carrying a cured resin. The product is designed for application to a substrate for printed circuit boards. The foil is to be etched away after a laminating cycle.

SUMMARY OF THE INVENTION

It is an object of the present invention to provide an improved adhesive coated, cured, insulating substrate usable as a printed circuit board base.

It is another object of the present invention to provide a cured, insulating substrate to which an adherent, firmly bonded electrolessly deposited metal layer can be applied.

A further object of the present invention is to provide a cured insulating substrate usable as a printed circuit board base and carrying an adhesive layer as an integral part thereof to which a metal layer can be deposited through conventional electroless plating techniques, with bond strength of the order of 8–10 pounds/square inch between the deposited metal layer and the substrate.

An additional object of the present invention is to provide an improved adhesive coated cured insulating substrate usable as a printed circuit board base wherein the adhesive layer is very thin but still yields high bond strength with electrolessly deposited metal.

Other objects of the invention will be apparent to the skilled artisan.

The above, as well as other objects, are provided by the present invention wherein a transfer base material carrying a coating of substantially solvent-free, uncured nitrile rubber/phenolic thermosetting adhesive is laminated to an insulating substrate, with the adhesive contacting the substrate, and, thereafter, the transfer base material is removed from the laminate.

In preferred embodiments of the present invention, the adhesive is a mixture of a phenolic thermosetting resin and butadiene-acrylonitrile rubbery polymer, the insulating substrate is impregnated with completely uncured or substantially uncured epoxy resin (i.e., at most, a B-stage cure has been carried out), and the transfer base material is a plastic film which can be peeled off of the adhesive after curing the composite.

DETAILED DESCRIPTION OF THE INVENTION

As described hereinbefore, nitrile/phenolic adhesives have been applied in at least a B-stage cure condition via a transfer film to the surface of insulating substrates suitable for printed circuit board use. The present invention is an improvement of this art. Accordingly, the insulating substrate, the nitrile/phenolic adhesive and the transfer film or carrier film can be as described in the prior art.

The insulating substrate is most usually a laminated material comprising prepregs of glass fiber cloth impregnated with thermosettable resin. Phenolic and epoxy thermosettable resins are conventional. In the present invention, epoxy resin is preferred, as will be discussed hereinafter. It is important to the present invention that the thermosettable resin be at most cured to the B-stage. This allows, theoretically, for inter-reaction between the thermosettable resin and the subsequently to be applied adhesive. Preferably, the thermosettable resin of the insulating substrate is applied to the prepreg lamina from a liquid and dried at a temperature below that at which any reaction between components takes place. This can be determined by routine chemical analysis, for example, by infrared spectrophotometry analysis and differential scanning colorimetry.

The nitrile rubber/phenolic adhesives are well known and available from a number of sources. These adhesives comprise a nitrile copolymer and a phenolic thermosetting resin. Most usually, the nitrile copolymer is acrylonitrile/butadiene copolymer known as a nitrile rubber. Another possibility would be inclusion of a third comonomer, such as styrene, i.e., acrylonitrile/butadiene/styrene terpolymer. Likewise, the phenolic thermosetting resins are well known, such as those used to impregnate prepregs, and need not be detailed herein. A commercially available adhesive is BR-238, nitrile/phenolic adhesive, from American Cyanamid, Harve de Grace, Maryland.

As discussed above, epoxy impregnated insulating substrate is preferred for use with the nitrile/phenolic adhesive. This is because of the extremely strong bonds formed. The adhesive becomes an integral part of the cured insulating substrate during the curing and laminating cycle of heat and pressure. In effect, the adhesive transfers to the insulating substrate and cures with the epoxy. During this mutual curing which would involve condensation and cross-linking reactions, it is believed that active hydrogen atoms of the adhesive (provided by —OH, —NH, etc, moieties) react with the oxirane moieties of the epoxy to become an integral part of the cured insulating substrate. It has been experimentally determined that BR-238 does not cure, even to a B-stage, at temperatures at or below about 150° F. Thus, when this particular material is used, it should not be subjected to temperatures above about 150° F. before being brought into contact with the insulating substrate. Using infrared spectrophotometry and differential scanning colorimetry techniques, the skilled artisan can determine the maximum temperature to which a specific nitrile rubber/phenolic thermosettable adhesive can be raised without curing taking place.

The transfer base or carrier sheet of the present invention may be selected from coated papers, plastic sheets and metallic foils. Preferably, a plastic sheet is employed, such as polyethylene, poly (vinyl chloride), poly (vinyl fluoride), polyester, polypropylene, polyoxymethylene and the like. At this time, a preferred transfer base material is Tedlar ® brand poly (vinyl fluoride) film available from DuPont.

Preferably, the transfer base material is selected to be peelable from the cured insulating substrate. It is believed any of the above transfer base materials can be utilized, sometimes requiring a mold release agent, such as a silicone resin, to aid removal. Furthermore, and particularly with metal foils, removal can be carried out using prior art etching procedures.

The adhesive can be coated on the transfer base material using any conventional procedure, usually the adhesive being applied from a volatile solvent solution or suspension of the adhesive, for example, using a draw down bar, spraying, dipping, doctor blade, web coating or the like techniques. The volatile solvent must not react with the adhesive and must be removable at a temperature below that causing curing of the adhesive. As an example, methyl ethyl ketone can be used as a volatile solvent and be flashed off at about 150° F. after application of the adhesive coating to the transfer base material. Other solvents will be apparent to the skilled artisan, such as methyl isobutyl ketone, benzene, acetone and mixtures of solvents.

One advantage of the present invention is that an extremely thin film of adhesive can be used to provide unusually high bond strengths. For example, the thickness of the adhesive applied to the insulating substrate prior to curing can be about 0.0003–0.0006 inches.

Once the transfer base material coated with adhesive is laminated to the insulating substrate, the composite is cured, the carrier film or foil removed and the cured insulating substrate is ready for electroless metal plating. The particular techniques used for electroless plating do not form part of the present invention. In general, the cured adhesive surface of the cured insulating substrate would probably be etched, seeded and the like prior to metal deposition. Furthermore, as is known in the art, the adhesive itself could contain various additives to further facilitate plating, such as seed nuclei and the like.

EXAMPLE

BR-238 adhesive is admixed with methyl ethyl ketone and methyl isobutyl ketone solvent (1:4) to form a 10–20% by weight solids solution.

The adhesive solution is applied to a Tedlar ® film using a draw down bar. The coated film is heated to 150° F. for 30 minutes to evaporate the solvent, leaving an adhesive layer about 0.3–0.6 mil thick (0.0003–0.0006 inches).

Then, the adhesive coated film is brought into contact with the surface of an epoxy prepreg where the epoxy is substantially uncured. The laminate, with the adhesive in contact with the prepreg, is heated to 340° F. for 1 hour at 500 psi pressure. Thereafter, the Tedlar ® film is peeled off of the laminate, revealing cured adhesive layer integral with the prepreg.

Following a chrome-sulfuric acid etch, seeding and application of a resist pattern, electroless metal plating is carried out. Subsequent removal of the resist reveals a printed circuit board.

Variations of the invention will be apparent to the skilled artisan, such as the drilling of holes into or through the adhesive-coated insulating substrate after curing.

What is claimed is:

1. A method for adhering an electroless plated metal to an insulating base impregnated with an uncured thermosat resin which comprises (A) coating a surface of a removable transfer material with an uncured nitrile rubber/phenolic thermosetting resin adhesive wherein the nitrile rubber consists essentially of an acrylonitrile/butadiene copolymer or an acrylonitrile/butadiene/styrene terpolymer, (B) bringing the coated surface of said transfer base material into contact with a surface of the insulating base to form a composite, (C) heating the composite under conditions to simultaneously cure the adhesive and the thermosetting resin of the insulating base, with said adhesive not being subjected to a temperature above about 150° F. prior to step (C), removing the transfer material and, (E) electroless plating a metal on the adhesive surface of the insulating base.

2. The process of claim 1 wherein the insulating base is impregnated with epoxy.

3. The process of claim 2 wherein the adhesive is applied to the transfer material from a volatile solvent carrier, and the solvent is evaporated therefrom prior to bringing the coated surface into contact with the insulating base surface.

4. The process of claim 3 wherein the solvent carrier comprises methyl ethyl ketone or methyl isobutyl ketone.

5. The process of claim 2 wherein the insulating base comprises glass fiber cloth.

6. The process of claim 2 wherein the adhesive is coated on the transfer material to about a 0.0003–0.0006 inch thick layer.

7. The process of claim 2 wherein the transfer material is a coated paper, a plastic sheet or a metallic foil.

8. The process of claim 7 wherein the plastic sheet is polyethylene, poly (vinyl chloride), poly (vinyl fluoride), polyester, polypropylene or polyoxymethylene.

9. The process of claim 8 wherein the plastic sheet is poly (vinyl fluoride).

10. The process of claim 2 wherein the transfer material is peeled from the adhesive surface.

11. The process of claim 2 wherein the transfer material is etched from the adhesive surface.

12. The process of claim 2 wherein, after removing the transfer material, a resist pattern is applied to the adhesive surface prior to the metal plating.

13. The process of claim 12 wherein the adhesive surface is chemically etched and seeded after removal of the transfer material but prior to applying the resist pattern.

14. An electroless plated insulating base made by the process of claim 1.

15. In a process for manufacturing a printed circuit board wherein a metal is electrolessly deposited on the surface of an epoxy-impregnated fiber glass cloth prepreg, the improvement to increase the adherence of the metal to the prepreg which comprises, prior to the metal deposition, (A) forming a coating of a substantially solvent-free, uncured nitrile rubber/phenolic thermosetting resin adhesive, wherein the nitrile rubber consists essentially of an acrylonitrile/butadiene copolymer or an acrylonitrile/butadiene/styrene copolymer, on a removable transfer material, (B) bringing the coated surface into contact with a surface of the prepreg wherein the epoxy is still substantially uncured to form a composite, (C) heating the composite under conditions to simultaneously cure the adhesive and the epoxy so that the adhesive becomes an integral part of the epoxy-impregnated prepreg, with said adhesive not being subjected to a temperature above about 150° F. prior to step (C) and (D) removing the transfer material.

16. The process of claim 15 wherein the adhesive is coated on the transfer material to about a 0.0003–0.0006 inch thick layer.

17. The process of claim 15 wherein the transfer material is a poly (vinyl fluoride) sheet.

18. A printed circuit board made by the process of claim 17.

* * * * *